United States Patent
Takeda et al.

(10) Patent No.: US 6,515,297 B2
(45) Date of Patent: Feb. 4, 2003

(54) CVD-SIC SELF-SUPPORTING MEMBRANE STRUCTURE AND METHOD FOR MANUFACTURING THE SAME

(75) Inventors: Shuichi Takeda, Yamagata (JP); Hiroaki Sato, Yamagata (JP)

(73) Assignee: Toshiba Ceramics Co., Ltd., Tokyo (JP)

(*) Notice: Subject to any disclaimer, the term of this patent is extended or adjusted under 35 U.S.C. 154(b) by 0 days.

(21) Appl. No.: 09/821,689

(22) Filed: Mar. 30, 2001

(65) Prior Publication Data

US 2002/0173125 A1 Nov. 21, 2002

(51) Int. Cl.[7] .............................................. H01L 29/06
(52) U.S. Cl. .......................................... 257/13; 117/88
(58) Field of Search ............. 257/13, 94; 438/795–796, 438/931; 427/162; 117/88–89, 101

(56) References Cited

U.S. PATENT DOCUMENTS

| 5,106,687 A | * | 4/1992 | Tanino et al. | 427/249.15 |
|---|---|---|---|---|
| 5,494,524 A | | 2/1996 | Inaba et al. | 118/728 |
| 5,937,316 A | | 8/1999 | Inaba et al. | 438/488 |
| 6,147,020 A | * | 11/2000 | Nishioka et al. | 501/88 |

FOREIGN PATENT DOCUMENTS

| JP | 4-358068 | 12/1992 |
|---|---|---|
| JP | 6-188306 | 7/1994 |
| JP | 7-188927 | 7/1995 |
| JP | 10-12563 | 1/1998 |
| JP | 11-121315 | 4/1999 |

* cited by examiner

*Primary Examiner*—David Nelms
*Assistant Examiner*—David Vu
(74) *Attorney, Agent, or Firm*—Foley & Lardner

(57) ABSTRACT

The present invention provides a CVD-SiC self-supporting membrane structure having a plurality of SiC layers laminated by a CVD method, wherein a layer A having a peak intensity (height) ratio $r=\beta(220)/\beta(111)$ of $\beta$ (220) peak to $\beta$ (111) peak intensities of the X-ray diffracted beams in a thickness direction being 0.1 or more, and a layer B having a peak intensity ratio r of 0.01 or less are laminated alternately and repeatedly, and the layer A is laid on either side in the thickness direction.

4 Claims, 3 Drawing Sheets

CVD-SIC SELF-SUPPORTING MEMBRANE STRUCTURE AND METHOD FOR MANUFACTURING THE SAME

BACKGROUND OF THE INVENTION

1. Field of the Invention

The present invention relates to a CVD-SiC self-supporting membrane structure composed of a CVD-SiC membrane simple substance of high purity. More specifically, the invention relates to a CVD-SiC self-supporting structure which is suitable for a jig or member for the semiconductor equipment, such as a holder (plate-like, ring-like) for transfer or supporting the wafer within the semiconductor thermal treatment equipment, a liner tube, a dummy wafer, and a gas introducing tube, for example, and a method for manufacturing the same.

2. Description of the Related Art

For the semiconductor process members, a single wafer processing and the fast thermal treatment process techniques have progressed along with the larger diameter and higher integration of silicone wafers. In such a process technique, the lighter weight and lower heat capacity of members for use with the equipment are required. As one solving means, a manufacturing technique for members with a CVD self-supporting membrane structure has been examined (refer to JP-A-4-358068, JP-A-6-188306, JP-A-7-188927, and JP-A-10-12563). For example, in JP-A-7-188927, an invention was described in which the conventional CVD self-supporting membrane is weak in mechanical strength, because the crystal structure is anisotropic, and to improve this weakness, the orientation of crystal grains is randomized. Also, in JP-A-10-12563, an invention was described in which the absorption characteristics of the infrared ray are improved to enhance the temperature dependency in the thermal treatment of semiconductors. Further, in JP-A-11-121315, an invention was described in which because an optical sensor is employed in handling the process member, a plurality of layers made of silicon carbide are laid to make the member more likely to be sensed by the optical sensor.

By the way, in the conventional CVD-SiC self-supporting membrane structure, it was difficult to suppress appropriately the warp arising during the manufacture, particularly because the structure was thin, resulting in a problem of lower yield.

Also, in the wafer supporting holder, there is a need of supporting the silicon wafer of several tens grams, but in the CVD-SiC self-supporting membrane structure, the mechanical strength is insufficient, resulting in a problem of causing fracture or deterioration owing to the mechanical impact.

Further, when such CVD-SiC self-supporting membrane structure was used as a wafer supporting holder, a dummy wafer, a liner tube, or a gas introducing tube disposed within the thermal treatment equipment for semiconductor, there was a problem of causing crack or fracture in the structure, owing to the thermal shock, subjected to a heat history with high rate temperature rise or fall in making the thermal treatment of wafers.

SUMMARY OF THE INVENTION

The present invention has been achieved to solve the above-mentioned problems with the conventional art, and it is an object of the invention to improve the manufacturing yield of CVD-SiC self-supporting membranes by resolving the warp particularly after shaping the CVD-SiC self-supporting membranes, and improve the manufacturing yield of silicon devices by increasing the mechanical strength and the heat resistance to prevent fracture or particle development during the use of process members.

The present invention provides a CVD-SiC self-supporting membrane structure having a plurality of SiC layers laminated by a Chemical Vapor Deposition (CVD) method, wherein a layer A having a peak intensity (height) ratio $r=\beta(220)/\beta(111)$ of $\beta(220)$ to $\beta(111)$ peak intensities of the X-ray diffracted beams in a thickness direction being 0.1 or more, and a layer B having a peak intensity ratio r of 0.01 or less are laminated alternately and repeatedly, and the layer A is laid on either side in the thickness direction.

Also, the invention provides a method for manufacturing a CVD-SiC self-supporting membrane structure, including a step I of forming a CVD-SiC membrane that is a layer A by heating a substrate easily removable by burning or chemical treatment such as a carbon substrate, a tungsten substrate or a molybdenum substrate in the atmosphere of a mixture gas having a relatively lower concentration of hydrogen containing at least dichlorosilane, ethylene, and hydrogen, and a step II of forming a CVD-SiC membrane that is a layer B using a mixture gas having a higher concentration of hydrogen than the concentration of the mixture gas. The higher or lower concentration of hydrogen indicate the levels of hydrogen with a constant concentration of the source gases comprising dichlorosilane and ethylene. That is to say, the layer A is formed under the atmosphere condition of higher concentration of the source gas whereas the layer B is formed under that of lower concentration. The method further includes repeating these steps multiple times to form a CVD-SiC laminate membrane, forming the CVD-SiC membrane that is the layer A as the outermost layer, and then removing the substrate.

DESCRIPTION OF THE PREFERRED EMBODIMENTS

The present invention will be further described below in detail with reference to the drawings.

Figure 2:
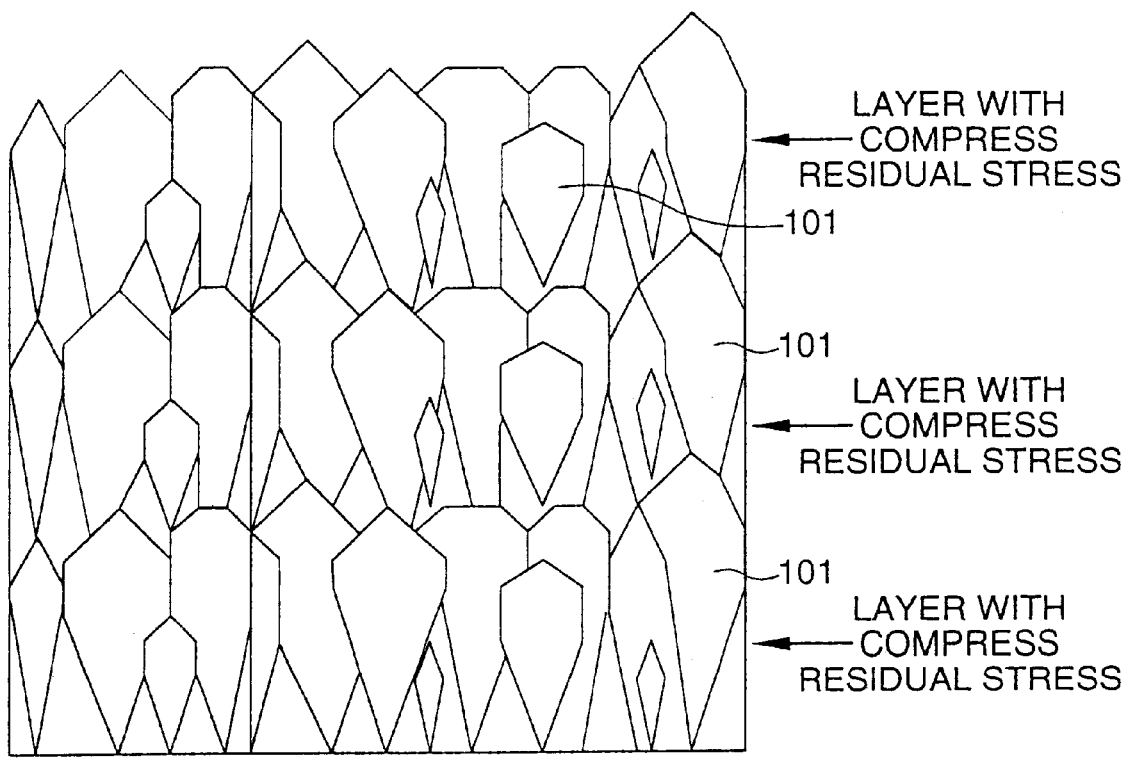
FIG. 2 is a typical view illustrating the crystal structure of a conventional CVD-SiC self-supporting structure only composed of a layer having a compressive residual stress.

The conventional CVD-SiC self-supporting structure is composed of the layers having the same crystal form in the compressive or tensile residual stress characteristics, as shown in FIG. 2, for example, this structure having a property of being more likely to cause a deformation or warp to relieve the stress.

Figure 1:
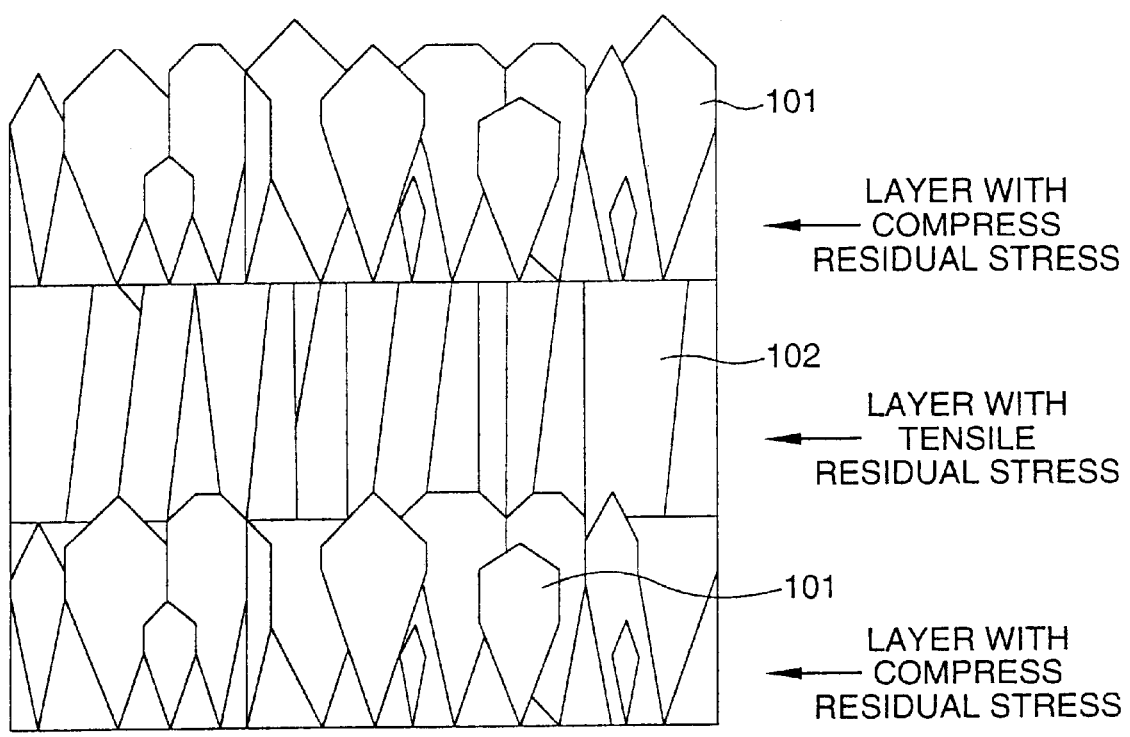
FIG. 1 is a typical view illustrating the crystal structure of a CVD-SiC self-supporting membrane structure of the present invention.

The present inventors have found that the outside surface preferably has preferably a compressive residual stress as high as possible, from the viewpoint of mechanical strength, in the CVD-SiC self-supporting membrane structure. Also, they have found that to prevent the warp of the CVD-SiC self-supporting membrane structure, the CVD-SiC self-supporting membrane structure may be formed by providing a laminated structure in which an odd number of layers of specific CVD-SiC membrane are laid, with the outermost layers on both sides having the same residual stress characteristics. From such knowledge, the inventors have completed this invention by considering that the problems can be solved in such a manner that a compressive residual stress layer and a tensile residual stress layer are alternately laid, and the compressive residual stress layer is disposed as the outermost layer, as shown in FIG. 1.

Figure 3:
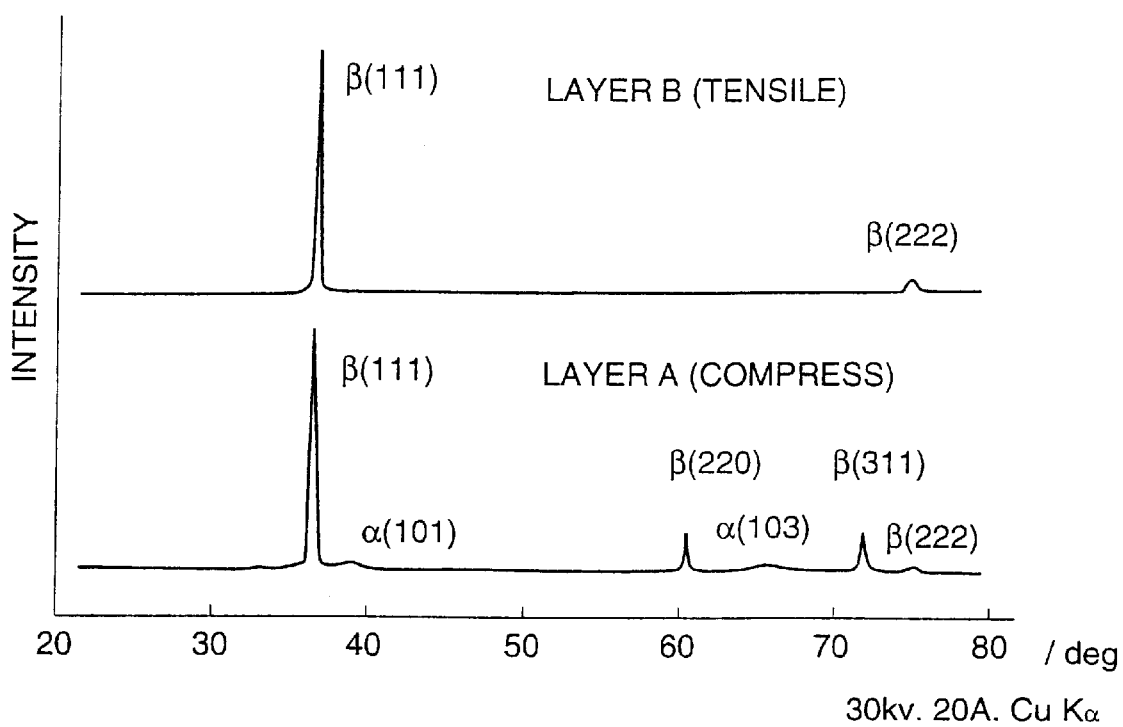
FIG. 3 is an X-ray diffraction graph of a CVD-SiC membrane.

By the way, in the CVD-SiC membrane, the residual stress can be measured on the single membrane, but it is difficult to measure the residual stress on the laminate membrane in a non-destructive way. Thus, the measurements of the X-ray diffraction for the single membrane having a compressive residual stress indicated that the single membrane has a multi oriented crystal having several X-ray diffraction peaks with a high orientation to the (111) plane and including the (220) plane, as will be apparent from FIG. 3. Also, the measurements of the X-ray diffraction for the single membrane having a tensile residual stress indicated that the single membrane has β-SiC having X-ray diffraction peaks with a high orientation to the (111) plane and no orientation to the (220) plane, as shown in FIG. 3.

As a result of more detailed examination, it was revealed that two sorts of layers having these residual stress characteristics can be specified and evaluated by a diffraction intensity ratio $r=\beta(220)/\beta(111)$ of the X-ray diffraction patterns, when the intensities (heights) of diffraction peak on the (220) plane and the (111) plane for the X-ray diffracted beams of β-SiC are $\beta(220)$ and $\beta(111)$, respectively.

That is, it was found that the CVD-SiC membrane with r of 0.1 or more has a compressive residual stress, and the CVD-SiC membrane with r of 0.01 or less has a tensile residual stress.

Accordingly, to provide the minimum compressive residual stress effective for the above uses, for example, r is necessary to be 0.1 or more. It is required to provide a layer B with r of 0.01 or less to provide a tensile residual stress inside this structure (in a thickness direction) to cause no warp during the manufacture for this compressive residual stress.

In the layer B having the tensile residual stress, it is r=0 or when $\beta(111)$ is highly oriented that its stress can be increased most greatly. It is necessary that the layer A formed at least on the outer surface of this structure has r of 0.1 to 0.2 to cause no warp during the manufacture for this tensile residual stress, in which the higher mechanical strength and the thermal shock resistance can be obtained.

In this invention, it is preferred that the thickness of the layer A is in a range from 10 $\mu$m to 1000 $\mu$m, and the thickness of the layer B is in a range from 10 $\mu$m to 400 $\mu$m. If the thickness of the layer A exceeds 1000 $\mu$m, the stress becomes excessive, and the deformation is more likely to occur. If the thickness of the layer A is below 10 $\mu$m, the residual stress is unlikely to occur, tending not to effect the full function in this invention. Also, if the thickness of the layer B exceeds 400 $\mu$m, the membrane is unstably attached, developing the interstice between layers, and causing a layer exfoliation, if an SiC membrane is formed on the layer B. If the thickness of the layer B is less than 10 $\mu$m, the membrane is difficult to have the desired residual stress characteristics.

The number of layers of CVD-SiC membrane may be an odd number of three or greater. However, since the number of steps increases with the more number of layers, five layers are most preferable in practice.

The CDV-SiC self-supporting structure of this invention can be manufactured by the following method. That is, a CVD-SiC membrane that is a layer A is formed on the surface of a substrate by heating the substrate easily removable by sintering or chemical treatment such as a carbon substrate, a tungsten substrate or a molybdenum substrate in the atmosphere of a mixture gas having a relatively lower concentration of hydrogen containing at least dichlorosilane, ethylene, and hydrogen (step I). This layer A becomes the layer having a compressive residual stress. Then, a CVD-SiC membrane that is a layer B is formed on the CVD-SiC membrane of the layer A, using a mixture gas having a higher concentration of hydrogen than in the mixture gas (step II). This layer B becomes the layer having a tensile residual stress. After a CVD-SiC laminate membrane is formed by repeating these steps multiple times, the CVD-SiC membrane that is the layer A having a compressive residual stress is formed (step I), and then the substrate is removed. Thereby, a CVD-SiC self-supporting membrane structure with the layer A disposed on either side in a thickness direction can be manufactured.

The manufacturing conditions of step I for forming the layer A having the compressive residual stress are as follows.

That is, in the mixture gas components, the volume ratio of components is preferably a:b=2.5:1 to 1.7:1 and b:c=1:10 to 1:18, supposing that the volume of dichlorosilane is a, the volume of ethylene is b and the volume of hydrogen is c, and more preferably a:b=2.2:1 to 1.9:1 and b:c=1:11 to 1:14.

The heating condition in step I is such that the heating time is from 5 to 10 hours in a temperature range from 1000° C. to 1200° C., and the optimal condition is 8 hours of heating at a temperature of 1100° C.

The membrane forming conditions in step II for forming the layer B having the tensile residual stress are as follows.

That is, in the mixture gas components, the volume ratio of components is preferably a:b=2.5:1 to 1.7:1 and b:c=1:22 to 1:28, and more preferably a:b=2.1:1 to 1.9:1 and b:c=1:24 to 1:26.

The heating condition in step II is such that the heating time is from 5 to 10 hours in a temperature range from 900° C. to 1100° C., and the optimal condition is 8 hours of heating at a highest temperature of 1000° C.

In the case where the above membrane forming condition is out of the specified range, it is difficult to obtain a CVD-SiC membrane having the required residual stress characteristics.

The substrate for use with the invention may be a material easily removable by burning or chemical etching, for example. These materials include carbon, tungsten, and molybdenum. When carbon is used, the substrate can be removed without having any damage on the CVD-SiC layer formed on its surface by sintering in the oxygen atmosphere. Also, the tungsten and molybdenum substrate can be easily removed by etching with acid such as nitric acid. The substrate is removed in the final step, but since the surface roughness of the substrate is directly transferred to the CVD-SiC layer, the surface roughness of the substrate is preferably adjusted to the surface roughness required for the CVD-SiC self-supporting membrane structure.

The mixture gas for use with the invention contains at least dichlorosilane, ethylene and hydrogen, and additionally may contain an inert component such as an argon or helium gas, or a minute amount of unavoidable impurities.

In this invention, the decomposition rate of each gas is so similar that an appropriate CVD-SiC membrane is easily formed, and a combination of gases is chosen. However, instead of dichlorosilane, other silane derivatives such as carbon tetrachloride and trichlorosilane may be employed, and instead of ethylene, methane derivatives such as methane and propane may be employed.

EXAMPLE 1

A disk-like carbon substrate having a thickness of 10 mm was thermally treated at a temperature of 1100° C. for eight hours in a gas atmosphere containing dichlorosilane, ethylene and hydrogen gases at a mixture ratio of 4:3:25 to form a layer A that is a compressive stress membrane 0.25 mm thick on the surface of the substrate (step I). Then, this disk-like carbon substrate was thermally treated at a temperature of 1000° C. for eight hours in a gas atmosphere containing dichlorosilane, ethylene and hydrogen gases at a mixture ratio of 2:1:25 to form a layer B that is a tensile stress membrane 0.25 mm thick on the compressive stress membrane of the substrate (step II). These steps were repeated multiple times to laminate the layer B and layer A each 0.25 mm thick alternately. Then, the carbon substrate was heated at a temperature of 1000° C. for 50 hours in an oxygen atmosphere, and sintered to produce an SiC dummy wafer φ150×t0.75 mm. The SiC dummy wafer obtained had an amount of warp of 0.04 mm.

As a result of the X-ray diffraction for the layers A and B of this SiC dummy wafer, it was confirmed that the crystal composition of layer B was β-SiC with little orientation to the (220) plane and highly oriented. to the (111) plane, the diffraction intensity ratio r of $\beta(220)/\beta(111)$ being 0.

Also, the crystal composition of layer A was highly oriented to the (111) plane, and multi-oriented with several orientations including the (220) plane. The diffraction intensity ratio r of $\beta(220)/\beta(111)$ was 0.15.

This SiC dummy wafer was tested for the bending strength, in accordance with an expression as shown in JIS R1632, and the bending strength was measure by correcting the strength factor associated with the dummy wafer shape. Consequently, the bending strength was 480 MPa.

Further, to examine the thermal shock resistance for this CVD-SiC self-supporting membrane structure, a heat cycle that this SiC dummy wafer was heated at a rate of 30° C./min, kept at a temperature of 1000° C. for 30 minutes, and then cooled to room temperatures in the atmosphere was repeated, and the number of cycles by which a crack occurred in the SiC dummy wafer was measured.

As a result, with the SiC dummy wafer in this example, after 80 heat cycles, no crack was observed.

Comparative Examples 1, 2

To confirm the state of the residual stress of each layer in the example 1, each single layer was formed 0.75 mm thick under the same manufacturing conditions as the layers A and B on the surface of a high purity carbon substrate of φ150×t10 mm, and then the carbon material was burned and removed by oxidation.

As a result, it was observed that the layer A had a curved deformation (warp) of concave shape on the substrate removed by oxidation. The amount of warp was 0.3 mm. Namely, it was confirmed that the membrane had a compressive residual stress on the side of a carbon substrate face with CVD applied.

Also, it was observed that the layer B had a curved deformation (warp) of convex shape on the side of the carbon substrate. Namely, it was confirmed that the membrane had a tensile residual stress on the side of a carbon substrate face with CVD applied.

EXAMPLE 2

An SiC dummy wafer was produced in the same way as in the example 1, except that the internal pressure of a furnace was increased. As a result, the SiC dummy wafer with the r value of layer A being 0.10 and the r value of layer B being 0.0038 was produced. The SiC dummy wafer obtained was measured for the warp, bending strength and crack occurrence number. The measured results were listed in Table 1.

Comparative Examples 3, 4

A dummy wafer was produced in the same way as in the example 1, except that the layer structure was BABAB and ABAB. The results were also listed in Table 1.

In a comparative example 3, the bending strength was small, and the strength to shock was also small. In a comparative example 4, an SiC dummy wafer had a large warp, and it was difficult to manufacture the SiC dummy wafer in accordance with the standards.

Comparative Examples 5, 6

An SiC dummy wafer was produced in the same way as in the example 1, except that to make the r values of the layers A and B 0.08 and 0.03, the volume ratio of components was a:b=2.5:1 and b:c=1:25 for the former, and a:b=2.25:1 and b:c=1:25 for the latter, supposing that the volume of dichlorosilane is a, the volume of ethylene is b and the volume of hydrogen is c. The results were also listed in Table 1. These SiC dummy wafers had large warp and were impractical.

EXAMPLE 3

An SiC dummy wafer was produced in the same way as in the example. 1, except that the volume ratio of components was a:b:c=2:1:10, and the heating temperature was slightly increased. The results were also listed in Table 1. This SiC dummy wafer had slightly large warp, but was sufficiently practical.

EXAMPLE 4

An SiC dummy wafer was produced in the same way as in the example 1, except that the layer structure was three layers of ABA.

The results were also listed in Table 1. This SiC dummy wafer did not reach the level of the example 1 with a five layer structure in the thermal shock resistance, but had less deformation and was sufficiently practical.

TABLE 1

| Example Comparative example | Structure of layer | Thickness of layer | | $r = \beta(220)/\beta(111)$ | | Warp direction/Warp amount (mm) | Bending strength (Mpa) | Cracks (80 tests) |
|---|---|---|---|---|---|---|---|---|
| | | Layer A | Layer B | Layer A | Layer B | | | |
| Ex. 1 | ABABA | 150 | 150 | 0.15 | 0 | Convex upward/0.04 | 480 | — |
| Comp. ex. 1 | A | 750 | — | 0.15 | — | Convex upward/0.3 | 500 | — |

TABLE 1-continued

| Example Comparative example | Structure of layer | Thickness of layer Layer A | Thickness of layer Layer B | r = β(220)/β(111) Layer A | r = β(220)/β(111) Layer B | Warp direction/Warp amount (mm) | Bending strength (Mpa) | Cracks (80 tests) |
|---|---|---|---|---|---|---|---|---|
| Comp. ex. 2 | B | — | 750 | — | 0 | Convex downward/0.25 | 270 | 18 |
| Ex. 2 | ABABA | 150 | 150 | 0.10 | 0.0038 | Convex upward/0.1 | 420 | — |
| Comp. ex. 3 | BABAB | 150 | 150 | 0.15 | 0 | Convex downward/0.15 | 450 | 14 |
| Comp. ex. 4 | ABAB | 150 | 150 | 0.15 | 0 | Convex upward/0.08 | 330 | 27 |
| Comp. ex. 5 | ABABA | 150 | 150 | 0.08 | 0 | Convex downward/0.2 | 380 | — |
| Ex. 3 | ABABA | 150 | 150 | 0.23 | 0 | Convex upward/0.1 | 480 | — |
| Comp. ex. 6 | ABABA | 150 | 150 | 0.15 | 0.03 | Convex upward/0.13 | 440 | — |
| Ex. 4 | ABA | 250 | 250 | 0.15 | 0 | Convex upward/0.05 | 490 | 78 |

What is claimed is:

1. A CVD-SiC self-supporting membrane structure having a plurality of SiC layers laminated by a CVD method, wherein a layer A having a peak intensity (height) ratio $r=\beta(220)/\beta(111)$ of $\beta(220)$ to $\beta(111)$ peak intensities of the X-ray diffracted beams in a thickness direction being 0.1 or more, and a layer B having a peak intensity ratio r of 0.01 or less are laminated alternately and repeatedly, and said layer A is laid on either side in said thickness direction.

2. The CVD-SiC self-supporting membrane structure according to claim 1, wherein said peak intensity ratio of said layer A is from 0.1 to 0.2, and said peak intensity ratio of said layer B is 0.

3. The CVD-SiC self-supporting membrane structure according to claim 2, wherein the thickness of said each layer A is from 10 to 1000 μm, and the thickness of said each layer B is from 10 to 400 μm.

4. The CVD-SiC self-supporting membrane structure according to claim 1, wherein the thickness of said each layer A is from 10 to 1000 μm, and the thickness of said each layer B is from 10 to 400 μm.

* * * * *